(12) United States Patent
Tseng et al.

(10) Patent No.: US 11,862,080 B2
(45) Date of Patent: Jan. 2, 2024

(54) DISPLAY PANEL AND DRIVING METHOD THEREOF

(71) Applicant: HON HAI PRECISION INDUSTRY CO., LTD., New Taipei (TW)

(72) Inventors: Te-En Tseng, New Taipei (TW); Tsai-Yi Chien, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 17/992,558

(22) Filed: Nov. 22, 2022

(65) Prior Publication Data
US 2023/0169916 A1   Jun. 1, 2023

(30) Foreign Application Priority Data
Nov. 26, 2021   (CN) .......................... 202111422849.4

(51) Int. Cl.
| | | |
|---|---|---|
| G09G 3/00 | (2006.01) | |
| G09G 3/3208 | (2016.01) | |
| G09G 3/20 | (2006.01) | |
| H10K 59/38 | (2023.01) | |
| H10K 59/12 | (2023.01) | |
| H10K 59/35 | (2023.01) | |

(52) U.S. Cl.
CPC ......... *G09G 3/3208* (2013.01); *G09G 3/2096* (2013.01); *H10K 59/38* (2023.02); *G09G 2300/0452* (2013.01); *G09G 2320/0666* (2013.01); *G09G 2330/08* (2013.01); *G09G 2330/10* (2013.01); *H10K 59/12* (2023.02); *H10K 59/35* (2023.02)

(58) Field of Classification Search
CPC ...... G09G 3/3208; G09G 3/20; G09G 3/2096; G09G 2300/0452; G09G 2320/0666; G09G 2330/08; G09G 2330/10; H01L 33/62; H01L 25/075; H01L 33/38; H10K 59/38; H10K 59/35; H10K 59/12
See application file for complete search history.

(56) References Cited

U.S. PATENT DOCUMENTS

| | | | |
|---|---|---|---|
| 2017/0193926 A1* | 7/2017 | de Greef | G09G 3/2003 |
| 2021/0066562 A1* | 3/2021 | Hsieh | H01L 24/27 |
| 2022/0051616 A1 | 2/2022 | Li | |

FOREIGN PATENT DOCUMENTS

| | | |
|---|---|---|
| CN | 110738969 | 1/2020 |
| TW | 202119652 | 5/2021 |

* cited by examiner

*Primary Examiner* — Michael A Faragalla
(74) *Attorney, Agent, or Firm* — ScienBiziP, P.C.

(57) ABSTRACT

A display panel with a less costly backup arrangement for failed light-emitting elements and a driving method thereof are disclosed. The display panel includes a plurality of pixels. Each pixel includes a plurality of main sub-pixels and a backup sub-pixel. For any one of the pixels, if there is a failed main sub-pixel, the backup sub-pixel is activated and configured for cooperating with non-failed main sub-pixels to output metamerized light of a desired target color in order that no change in color or brightness is perceived by a viewer.

10 Claims, 7 Drawing Sheets

US 11,862,080 B2

DISPLAY PANEL AND DRIVING METHOD THEREOF

FIELD

The subject matter herein generally relates to displays, specifically to a display panel and a method for driving the display panel.

BACKGROUND

Failed light-emitting elements in self-luminous display panels must be replaced or repaired to improve yield of the displays. Currently, a method of repairing the self-luminous display panels is to directly detach the failed light-emitting element, and re-bond a qualified light-emitting elements for replacement. However, due to the small size of the light-emitting elements (e.g., micron scale), repair is difficult and time-consuming. Another method is to create a redundant light-emitting element for each original light-emitting element. If the original light-emitting element fails, the redundant light-emitting element is activated. However, in this method, the number of light-emitting elements in the display panel increases sharply, and the cost increases accordingly.

Therefore, there is room for improvement in the art.

BRIEF DESCRIPTION OF THE DRAWINGS

Implementations of the present disclosure will now be described, by way of embodiment, with reference to the attached figures.

DETAILED DESCRIPTION

Figure 1:
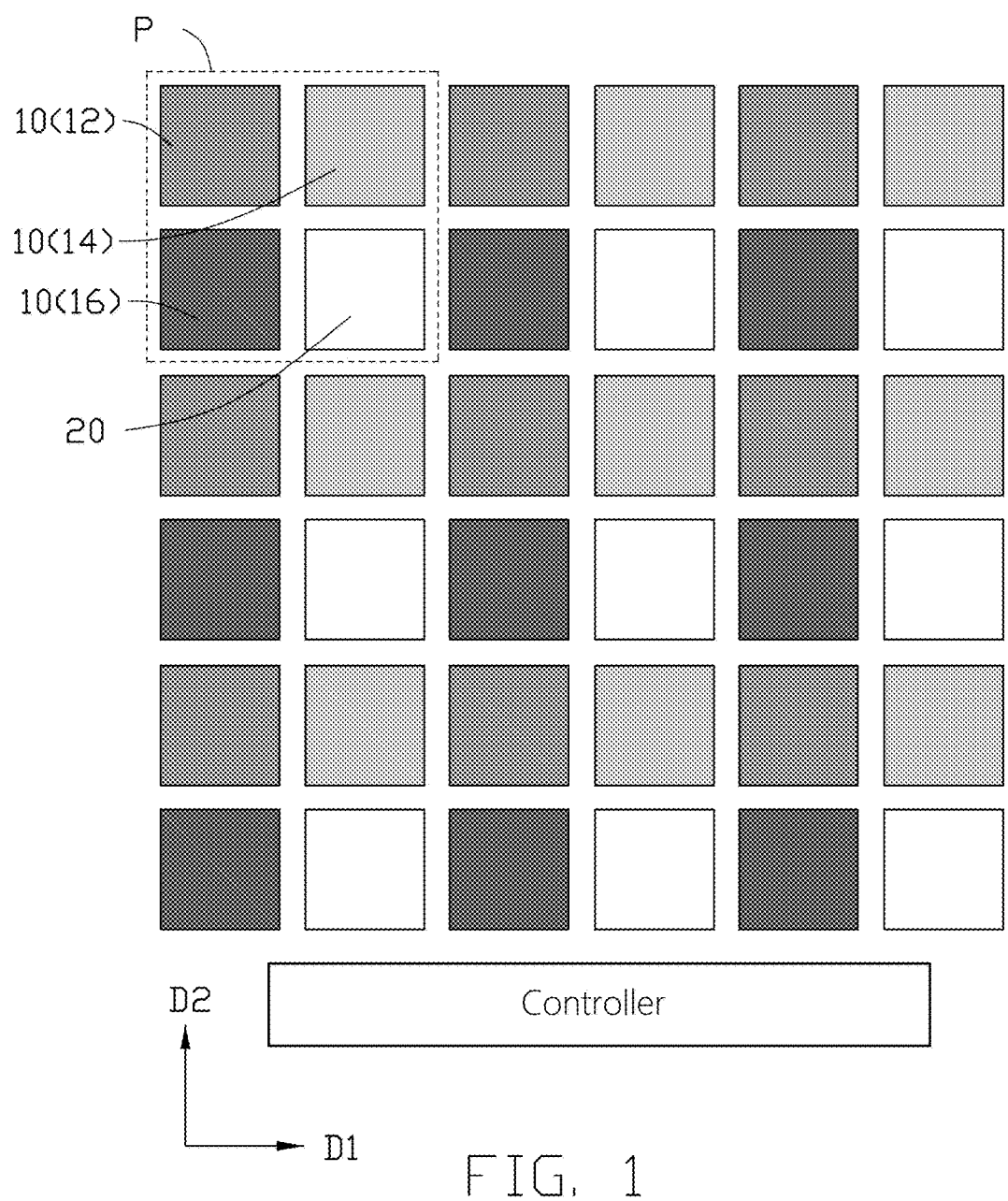
FIG. 1 is a schematic view of an arrangement of pixels of a display panel according to an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein may be practiced without these specific details. In other instances, methods, procedures, and components have not been described in detail so as not to obscure the related relevant feature being described. Also, the description is not to be considered as limiting the scope of the exemplary embodiments described herein. The drawings are not necessarily to scale, and the proportions of certain parts may be exaggerated to better illustrate details and features of the present disclosure.

The term "comprising" when utilized, means "including, but not necessarily limited to"; it specifically indicates open-ended inclusion or membership in the so-described combination, group, series, and the like. The disclosure is illustrated by way of example and not by way of limitation in the figures of the accompanying drawings in which like references indicate similar elements. It should be noted that references to "an" or "one" embodiment in this disclosure are not necessarily to the same embodiment, and such references can mean "at least one". The term "circuit" is defined as an integrated circuit (IC) with a plurality of electric elements, such as capacitors, resistors, amplifiers, and the like.

In colorimetry, metamerism is a perceived matching of colors with different (nonmatching) spectral power distributions. Colors that can be made to match this way are called metamers. A spectral power distribution describes the proportion of total light given off (emitted, transmitted, or reflected) by a color sample at each visible wavelength; it defines complete information about the light coming from the sample. However, the human eye contains only three color receptors (three types of cone cells), which means that all colors are reduced to three sensory quantities, called the tristimulus values. Metamerism occurs because each type of cone responds to the cumulative energy from a broad range of wavelengths, so that different combinations of light across all wavelengths can produce an equivalent receptor response and the same tristimulus values or color sensation. In color science, the set of sensory spectral sensitivity curves is numerically represented by color matching functions.

A method of adjusting two colors to be visually identical is called color matching. In a color matching task, a value of the three primary colors (i.e., red, green, and blue) required to match a color to be measured is called the tristimulus value. International Commission on Illumination (CIE) proposed the CIE 1931 XYZ system, which established a new chromaticity system with the three imaginary primary colors defined as X, Y, and Z. The CIE 1931 XYZ system is suitable for viewing angles from 1 degree to 4 degrees. In order to adapt to color measurement in wide field of view, CIE additionally proposed the CIE1964 supplementary standard chromaticity system in 1964, which was obtained through observation and testing by multiple observers over a 10-degree field of view. Tristimulus color is based on the three primary color receptors of the human eye and quantified into various tristimulus values of X, Y, and Z. The tristimulus values of X, Y, and Z are superimposed from the object reflection spectrum, the illumination spectrum, and the CIE standard observer spectrum tristimulus value curve. The spectral power distributions of two colors that human eyes perceive as the same (that is, the tristimulus values of the two colors are the same) can be the same or different. Metamerism is a phenomenon where the color of two objects appears the same under a particular light source for a particular standard observer, but actually have different spectral power distributions. In other words, metamerism produces color that has different spectral power distributions for a specific standard observer and a specific light source but has the same tristimulus values.

FIG. 1 shows an arrangement of pixels P of a display panel 100 according to an embodiment of the present disclosure. The display panel 100 includes a plurality of pixels P. Each pixel P includes a plurality of main sub-pixels 10 and a backup sub-pixel 20. For any one of the pixels P, if there is no failure of main sub-pixels, the backup sub-pixel 20 does not work, and the plurality of main sub-pixels 10 cooperate to emit light, so that the pixel P outputs a target color; if there is a failed main sub-pixel, the backup sub-pixel 20 cooperates with the non-failed main sub-pixels (i.e., normal main sub-pixels) to emit light i, so that the pixel P outputs mesmerized light of the target color.

The display panel 100 utilizes the phenomenon of metamerism and adjusts the spectrum of each pixel P, so that the human eye perceives the same color or colors regardless of whether there is a failed main sub-pixel in the pixel P. Compared with the method of directly removing the failed light-emitting element and re-bonding a working light-emitting element as replacement, the difficulty of repair is reduced, and time is saved. In addition, compared with the method of preparing a backup light-emitting element for each light-emitting element, the display panel 100 reduces the number of light-emitting elements and thus reduces the cost.

As shown in FIG. 1, the pixels P are arranged in a plurality of columns along a first direction D1, and a plurality of rows in a second direction D2. The first direction D1 intersects with the second direction D2. Specifically, in FIG. 1, the first direction D1 is perpendicular to the second direction D2. Each pixel P includes three main sub-pixels 10 and one backup sub-pixel 20. The three main sub-pixels 10 are a red sub-pixel 12 for emitting red light, a green sub-pixel 14 for emitting green light, and a blue sub-pixel 16 for emitting blue light. The red sub-pixels 12, the green sub-pixels 14, the blue sub-pixels 16, and the backup sub-pixels 20 in each pixel P are arranged in a 2×2 matrix. The red sub-pixel 12 and the green sub-pixel 14 are arranged in a first row of each pixel P, and the blue sub-pixel 16 and the backup sub-pixel 20 are arranged in a second row of each pixel P. In a row, each red sub-pixel 12 is alternating with one green sub-pixel 14, and each blue sub-pixel 16 is alternating with one backup sub-pixel 20 in the second row. Each red sub-pixel 12 is alternating with one blue sub-pixel 16 in a column, and each green sub-pixel 14 is alternating with one backup sub-pixel 20 in the next column.

In other embodiments, the arrangement of the main sub-pixels 10 and backup sub-pixels 20 is not limited to that shown in FIG. 1, and as long as the arrangement is in a 2×2 matrix. In addition, each pixel P is not limited to include the main sub-pixels of the above three colors, and may also include main sub-pixels that emit light of other colors. For example, each pixel P can include white sub-pixels for emitting white light, yellow sub-pixels for emitting yellow light, or cyan sub-pixels for emitting cyan light, and so on.

In some embodiments, the number of the main sub-pixels 10 and the backup sub-pixels 20 in one pixel P is not limited to that shown in FIG. 1, and the arrangement of the sub-pixels in each pixel P is not limited to a 2×2 matrix arrangement. For example, each pixel P may include six sub-pixels in a 2×3 matrix or a 3×2 arrangement.

In some embodiments, the main sub-pixel 10 includes a main light-emitting element (not shown) and a color conversion layer on a light-emitting side of the main light-emitting element. The light emitted from the main light-emitting element is converted into a desired color by passing through the color conversion layer. For example, the main light-emitting element is an inorganic light-emitting diode (LED) that emits blue light or an organic light-emitting diode (OLED) that emits blue light, and a material of the color conversion layer is quantum dots or phosphors. The material of the color conversion layer in the red sub-pixel 12 converts the blue light emitted by the main light-emitting element into red, and the material of the color conversion layer in the green sub-pixel 14 converts the blue light emitted by the main light-emitting element into green. The material of the color conversion layer in the blue sub-pixel 16 converts the blue light emitted by the main light-emitting element into blue light with a desired wavelength band.

In other embodiments, the main sub-pixel 10 does not include a color conversion layer. For example, the red sub-pixel 12 includes a LED for emitting red light, the green sub-pixel 14 includes a LED for emitting green light, and the blue sub-pixel 16 includes a LED for emitting blue light.

Figure 2:
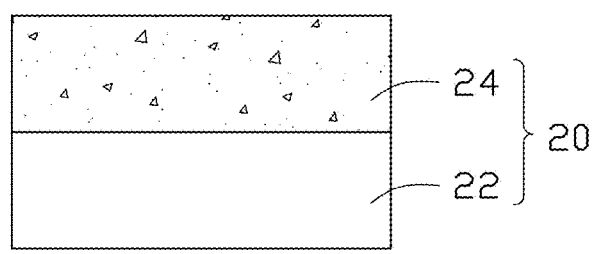
FIG. 2 is a schematic structural view of a backup sub-pixel within the array shown in FIG. 1.

As shown in FIG. 2, the backup sub-pixel 20 includes a backup light-emitting element 22 that emits blue light and a color conversion layer 24. The color conversion layer 24 is located on a light-emitting side of the backup light-emitting element 22 for converting the blue light emitted by the backup light-emitting element 22 into white light. The display panel 100 enables the pixel P to output the mesmerized light of the target color by adjusting the spectral power of the white light converted from the blue light. The backup light-emitting element 22 may be an OLED that emits blue light or a LED that emits blue light, and a material of the color conversion layer 24 is quantum dots or phosphors. In other embodiments, the backup sub-pixel 20 is not limited to be a sub-pixel that emits white light, and can be a sub-pixel that emits light of other colors, for example, a yellow sub-pixel that emits yellow light, a cyan sub-pixel that emits cyan light, and the like.

In some embodiments, both the main sub-pixels 10 and the backup sub-pixel 20 include a color conversion layer, and the color conversion layer of the main sub-pixels 10 and the color conversion layer of the backup sub-pixel 20 are of the same type, and the main light-emitting element and the backup light-emitting element 22 are of the same type. For example, in the main sub-pixel 10 and the backup sub-pixel 20, the color conversion layers are both quantum dots or both phosphors; the main light-emitting element and the backup light-emitting element 22 are all OLEDs.

In some embodiments, the size of the LED or OLED is less than 100 microns. That is, the light-emitting elements in the main sub-pixels 10 and the backup sub-pixel 20 are micro LEDs or micro OLEDs. The display panel with micro LEDs as the light-emitting elements has the characteristics of high resolution, low power consumption, high brightness, high contrast, high color saturation, fast response speed, thin thickness, and long life.

Compared with the method of preparing a redundant light-emitting element for each light-emitting element, the display panel 100 reduces the number of light-emitting elements, thereby reducing an area of a driving circuit, improving yield, and reducing cost. In addition, traditional repair techniques for light-emitting elements (e.g., micro LEDs), such as ultraviolet irradiation repair technology, laser fusing repair technology, selective pick-up repair technology, selective laser repair technology, and so on, at least include a de-bonding process of removing the LEDs from a driving substrate, a cleaning process, a re-bonding process of fixing the LEDs on the driving substrate and so on, which is complicated. The display panel of the present disclosure uses the phenomenon of metamerism to adjust the spectrum of the pixels P, so that human eyes perceive the same color regardless of whether there is a failed main sub-pixel in each pixel P. Therefore, no secondary transfer is required, the repair process is simplified, and repair cost of light-emitting elements (such as micro LEDs) is reduced.

In FIGS. 3A to 3D, a pixel P includes one red sub-pixel 12, one green sub-pixel 14, one blue sub-pixel 16 and one backup sub-pixel 20 emitting white light as an example for description. In FIGS. 3A to 3D, the curve marked "T" is a target output spectral power curve, and the curves marked as "R", "G", "B", "W" are actual output spectral power curves of the red sub-pixel 12, the green sub-pixel 14, the blue sub-pixel 16 and the backup sub-pixel 20, respectively. In FIGS. 3A to 3D, the horizontal axis represents the wavelength, and the vertical axis represents intensity of spectral power.

Figure 3A:
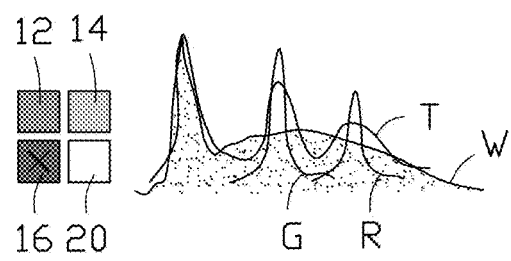
FIG. 3A is a schematic view of a spectral power output curve of a pixel in FIG. 1 when the pixel includes a failed blue sub-pixel.
Figure 3B:
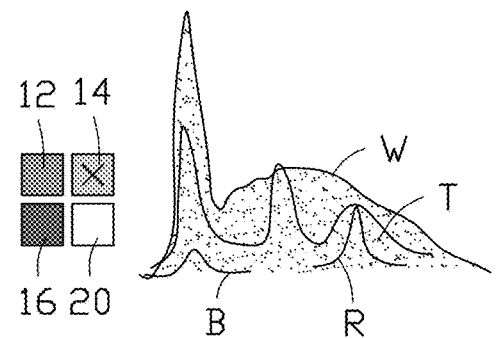
FIG. 3B is a schematic view of a spectral power output curve of a pixel in FIG. 1 when the pixel includes a failed green sub-pixel.
Figure 3C:
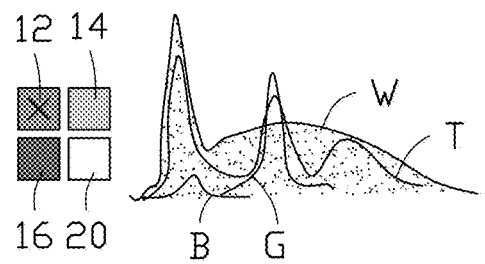
FIG. 3C is a schematic view of a spectral power output curve of a pixel in FIG. 1 when the pixel includes a failed red sub-pixel.
Figure 3D:
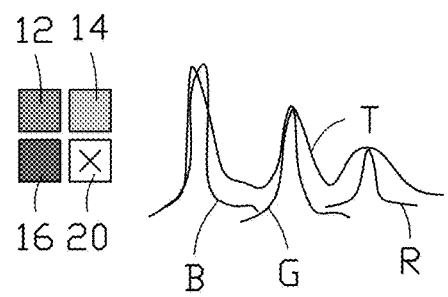
FIG. 3D is a schematic view of a spectral power output curve of a pixel in FIG. 1 when the blue, green, and red sub-pixels in the pixel are all working.

In FIG. 3A, the failed main sub-pixel 10 is the blue sub-pixel 16. In FIG. 3B, the failed main sub-pixel 10 is the green sub-pixel 14. In FIG. 3C, the failed main sub-pixel 10 is the red sub-pixel 12. In FIG. 3D, the three main sub-pixels 10 are all normal sub-pixels which would normally emit light. That is, for the pixel P shown in FIG. 3D, the backup sub-pixel 20 does is not emitting light as the three main sub-pixels 10 cooperate to emit light, so that the pixel P outputs the target color. For the pixels P shown in FIG. 3A to FIG. 3C, each pixel P has one failed sub-pixel not emitting light, and the backup sub-pixel 20 cooperates with the non-failed main sub-pixels 10 to emit light, so that the pixel P outputs the metamerized light of the target color. The term "failed sub-pixel" also means a sub-pixel that is not working normally for some reason, and is referred to as a dead sub-pixel or a faulty sub-pixel.

Specifically, in FIG. 3A, the blue sub-pixel 16 is a dead sub-pixel, and the red sub-pixel 12, the green sub-pixel 14, and the backup sub-pixel 20 emit white light cooperatively to output the metamerized light of the target color. That is, although the spectral power distributions in FIG. 3A and FIG. 3D are different for a specific standard observer and a specific illuminator, the observer has exactly the same color perception (i e., the same tristimulus values). Similarly, in FIG. 3B, the green sub-pixel 14 is a dead sub-pixel and the blue sub-pixel 16, the red sub-pixel 12, and the backup sub-pixel 20 emits white light which, in cooperation, causes the output of metamerized light of the target color. In FIG. 3C, the red sub-pixel 12 is a dead pixel, and the blue sub-pixel 16, the green sub-pixel 14, and the backup sub-pixel 20 cooperate to output the metamerized light of the target color. That is, in FIGS. 3A to 3D, although the spectral power distributions of the pixels P are different, the actual output spectral power curves by the pixels P have the same tristimulus values, and the human eyes perceive the same color.

In FIGS. 3A to 3D, each pixel P has one dead sub-pixel as an example. In other embodiments, if one pixel P has more than one dead sub-pixel, the actual spectral power curve of the backup sub-pixel 20 can still be adjusted to cooperate with the main sub-pixels 10 that have not failed, to output the metamerized light of the target color.

In addition, the display panel 100 can adjust the intensity of the spectral power of the white light emitted by each backup sub-pixel 20, so that the pixel P can continue to output light of the target color as metamerized light. That is, directly adjusting the spectral power output result of the pixel P with a dead sub-pixel, or adjusting for the standard human eye spectral sensitivity spectrum (also known as the CIE standard observer spectral tristimulus curve), is equivalent to directly adjusting the pixel P to obtain the target tristimulus value of X, Y, and Z, improving product yield.

In addition, the display panel 100 further includes a driving substrate (not shown). The main light-emitting elements and backup light-emitting elements are disposed on the driving substrate and are electrically connected to the driving substrate to emit light under the control of the driving substrate. The driving substrate is, for example, a thin film transistor substrate. In addition, the display panel 100 further includes a controller (such as a display driver IC, shown in FIG. 1) on the driving substrate to control the main sub-pixels 10 in pixel P, or the ones which are working plus the backup sub-pixel 20, to display the target color.

Figure 4:
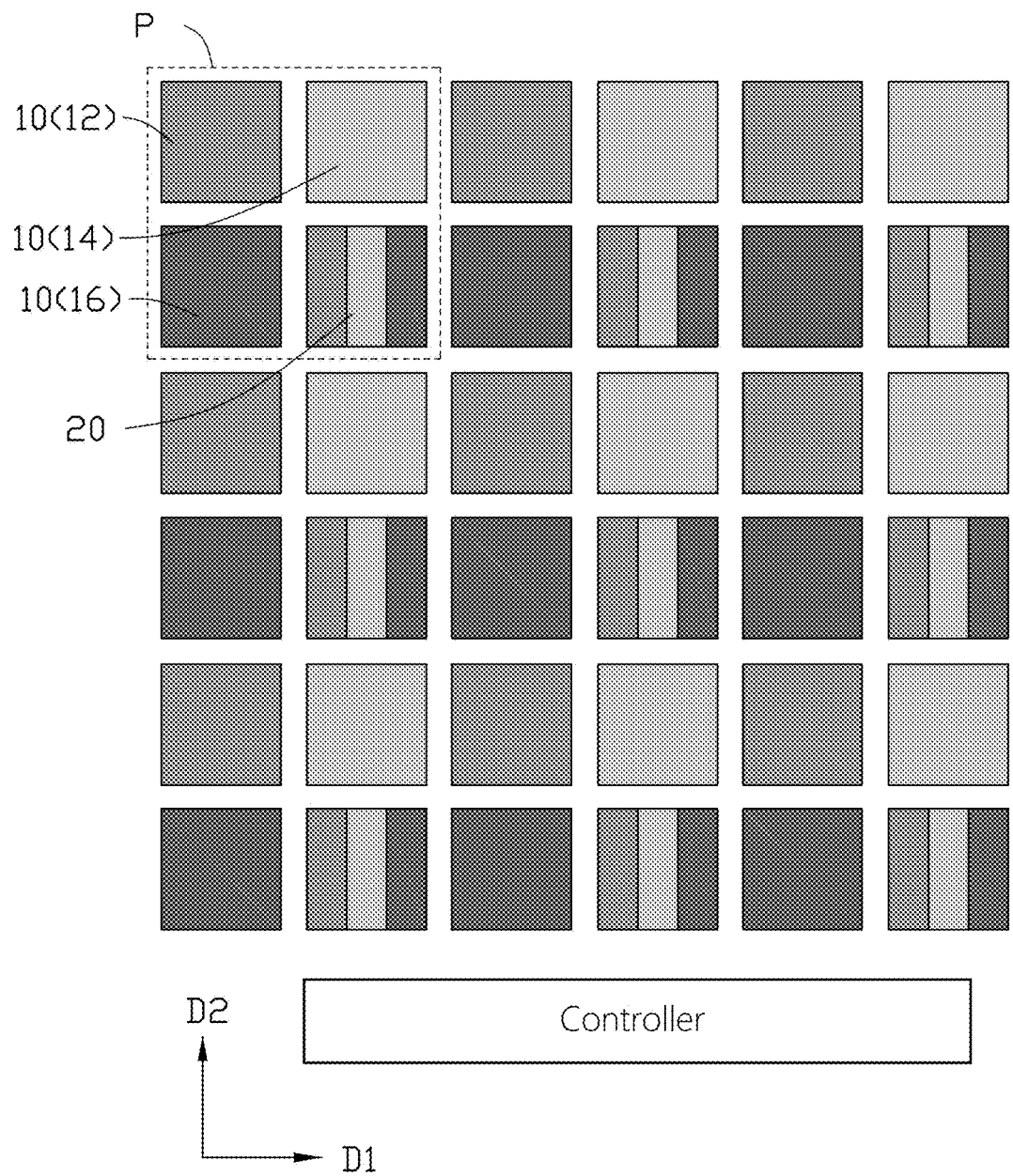
FIG. 4 is a schematic view of an arrangement of pixels of the display panel according to another embodiment of the present disclosure.

FIG. 4 shows an arrangement of pixels P of a display panel 200 according to another embodiment of the present disclosure. The difference between the display panel 200 and the display panel 100 in FIG. 1 lies in the structure of backup sub-pixels. In FIG. 4, the light emitted by each backup sub-pixel 20 can be one of the three primary colors (i.e., red, green, and blue) light, by a combination of any two of the three primary colors, or with light from the backup sub-pixel 20 mixed therein producing the three primary colors.

Figure 5:
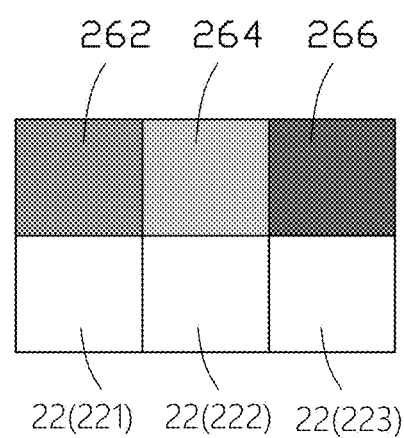
FIG. 5 is a schematic structural view of a backup sub-pixel in FIG. 4.

As shown in FIG. 5, the backup sub-pixel 20 includes three backup light-emitting elements 22 for emitting blue light (i.e., first, second, and third backup light-emitting elements 221, 222, and 223), a red conversion block 262, a green conversion block 264 and a blue conversion block 266. The red conversion block 262, the green conversion block 264, and the blue conversion block 266 are located on a light-emitting side of the three backup light-emitting elements 22 for converting the blue light emitted by the corresponding light-emitting elements into red light and green light and blue light, respectively. Specifically, the red conversion block 262 is on the first backup light-emitting element 221, the green conversion block 264 is on the second backup light-emitting element 222, and the blue conversion block 266 is on the third backup light-emitting element 223.

The display panel 200 independently adjusts the spectral power distribution of the red light converted from the blue light, the spectral power distribution of the green light converted from the blue light, and the spectral power distribution of the blue light converted from the blue light, so that each pixel P outputs metamerized light of the target color. Since the spectral power distribution of each primary color light (i.e., red light, green light, blue light) in each pixel P can be adjusted independently.

As shown in FIG. 4, the red conversion block 262, the green conversion block 264 and the blue conversion block 266 are arranged in sequence along the first direction D1. A size of each backup sub-pixel 20 is approximately the same as that of one main sub-pixel 10. In addition, a size of each backup light-emitting element 22 is approximately the same as that of the corresponding color conversion block (e.g., red conversion block 262, green conversion block 264, and blue conversion block 266). The materials of the red conversion block 262, the green conversion block 264, and the blue conversion block 266 are, for example, quantum dots or phosphors.

In FIGS. 6A to 6D, a pixel P includes one red sub-pixel 12, one green sub-pixel 14, one blue sub-pixel 16, and one backup sub-pixel 20 shown in FIGS. 4 and 5 as an example for description. In FIGS. 6A to 6D, the curve marked "T" is a target output spectral power curve, and the curves marked as "R", "G", "B", "W" are actual spectral power curves of the red sub-pixel 12, the green sub-pixel 14, the blue sub-pixel 16 and the backup sub-pixel 20, respectively.

Figure 6A:
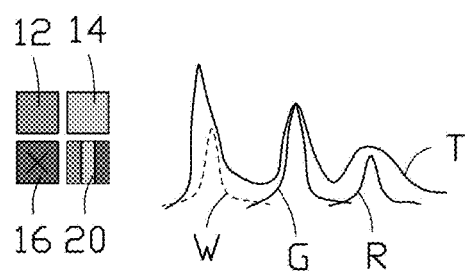
FIG. 6A is a schematic view of a spectral power output curve of a pixel in FIG. 4 when the pixel includes a failed blue sub-pixel.
Figure 6B:
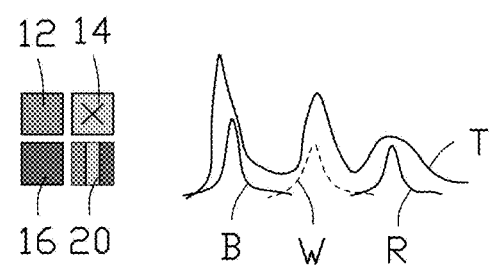
FIG. 6B is a schematic view of a spectral power output curve of a pixel in FIG. 4 when the pixel includes a failed green sub-pixel.
Figure 6C:
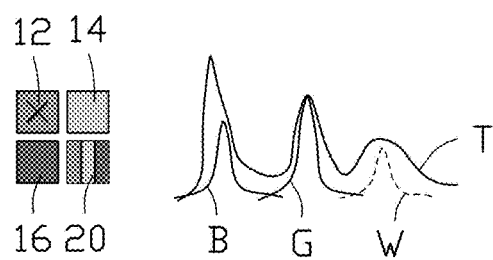
FIG. 6C is a schematic view of a spectral power output curve of a pixel in FIG. 4 when the pixel includes a failed red sub-pixel.
Figure 6D:
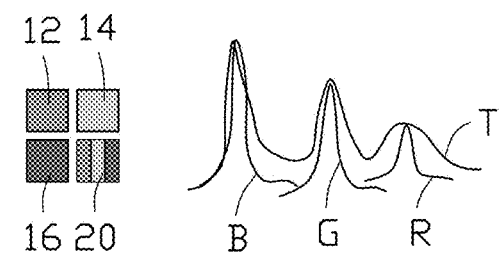
FIG. 6D is a schematic view of a spectral power output curve of a pixel in FIG. 4 when the blue, green, and red sub-pixels in the pixel are all working.

In FIG. 6A, the failed main sub-pixel 10 is the blue sub-pixel 16. In FIG. 6B, the failed main sub-pixel 10 is the green sub-pixel 14. In FIG. 6C, the failed main sub-pixel 10 is the red sub-pixel 12. In FIG. 6D, the three main sub-pixels 10 are all normal sub-pixels that can emit light normally. That is, for the pixel P shown in FIG. 6D, the backup sub-pixel 20 does not need to work or emit light, and the three main sub-pixels 10 cooperate to emit light, so that the pixel P outputs the target color. For the pixels P shown in FIG. 6A to FIG. 6C, each pixel P has one failed sub-pixel not emitting light, and the backup sub-pixel 20 cooperates with the remaining main sub-pixels 10 to emit light, so that the pixel P outputs the metamerized light of the target color.

Specifically, in FIG. 6A, the blue sub-pixel 16 is a dead pixel and the red sub-pixel 12, the green sub-pixel 14, and the backup sub-pixel 20 cooperate to output the metamerized light of the target color. That is, although the spectral power distributions of FIG. 6A and FIG. 6D are different for a specific standard observer and a specific illuminator, the observer has exactly the same color perception (i.e., have the same tristimulus values). Similarly, in FIG. 6B, the green sub-pixel 14 is a dead pixel, and the blue sub-pixel 16, the red sub-pixel 12, and the backup sub-pixel 20 cooperate to output metamerized light of the target color. In FIG. 6C, the red sub-pixel 12 is a dead pixel, and the blue sub-pixel 16, the green sub-pixel 14, and the backup sub-pixel 20 emit light cooperate to output metamerized light of the target color. That is, in FIGS. 6A to 6D, although the spectral power distributions of the pixels P are different, the actual output spectra power curves by the pixels P have the same tristimulus value, and the human eyes perceive the same color.

In FIGS. 6A to 6D, each pixel P has one dead sub-pixel as an example. In other embodiments, if one pixel P has more than one dead sub-pixel, the actual spectral power curve of the backup sub-pixel 20 can still be adjusted to cooperate with the non-failed main sub-pixels 10 to output metamerized light of the target color.

In addition, although "W" is marked in FIG. 6A to FIG. 6D, the light emitted by the backup sub-pixel 20 is not necessarily white light. That is, the light emitted by each backup sub-pixel 20 can be one of the three primary colors (i.e., red, green, and blue) light, a combination of any two of the three primary colors can still emit target color light. The display panel 200 independently adjusts the spectral power distribution of the red light converted from the blue light, the spectral power distribution of the green light converted from the blue light, and the spectral power distribution of the blue light converted from the blue light, so that each pixel P outputs metamerized light of the target color. That is, directly adjusting the spectral power output result of the pixel P with a dead sub-pixel, or adjusting for the standard human eye spectral sensitivity spectrum (also known as the CIE standard observer spectral tristimulus curve), is equivalent to directly adjusting the pixel P to obtain the target tristimulus value of X, Y, and Z, improving product yield.

In some embodiments, the display panel 100 and the display panel 200 further include a color filter layer (not shown), so that the uniformity of chromaticity of the main sub-pixels 10 or the sub-pixels 20 is better. For example, the three main sub-pixels 10 include three light-emitting elements for emitting red light, green light, and blue light, respectively. The color filter layer includes a red color filter block, a green color filter block, and a blue color filter block, each being corresponding to one light-emitting element. The red color filter block allows red light of a desired wavelength band to pass, while filtering out undesired wavelength bands. Correspondingly, the green color filter block allows green light of a desired wavelength band to pass, while filtering out undesired wavelength bands, and the blue color filter block allows blue light of a desired wavelength band to pass, while filtering out undesired other bands. In addition, when the main sub-pixels 10 include the color conversion layer 24, the color filter layer is on a side of the color conversion layer 24 away from the main light-emitting element. Similarly, when the backup sub-pixels 20 include a color conversion block, the color filter layer is on a side of the color conversion block away from the backup light-emitting element 22.

Figure 7:
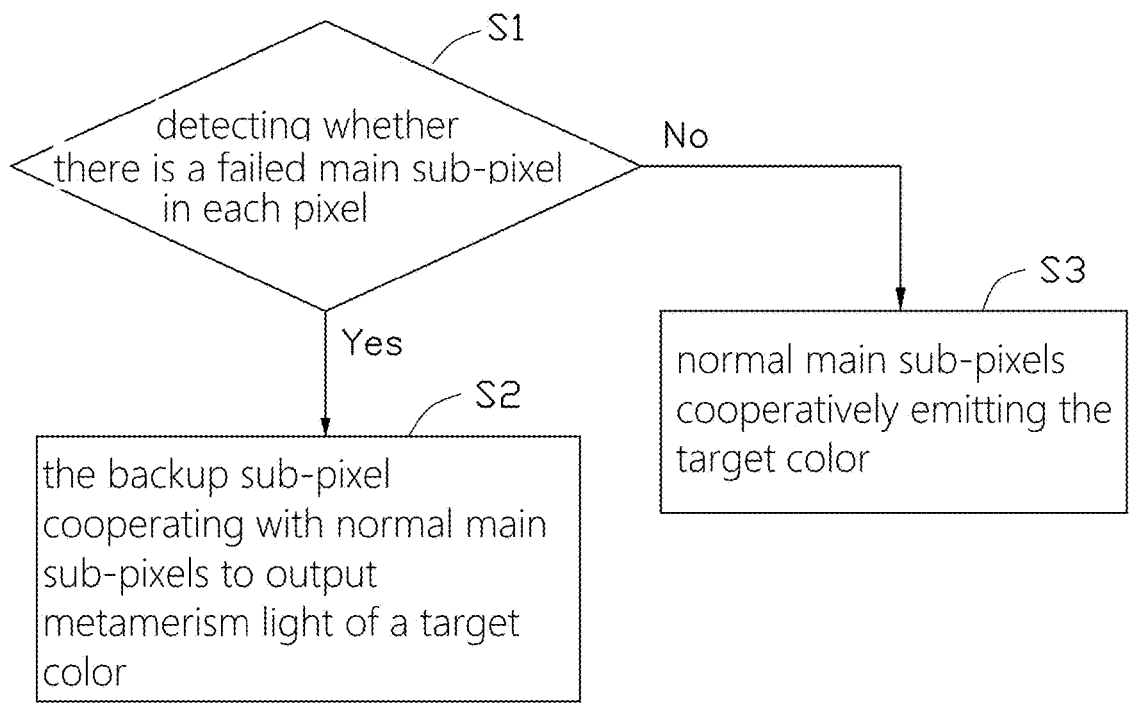
FIG. 7 is a flowchart of a method for driving a display panel according to an embodiment of the present disclosure.

FIG. 7 shows a flowchart of a method for driving a display panel according to an embodiment of the present disclosure. The display panel includes a plurality of pixels, each of the pixels includes a plurality of main sub-pixels and a backup sub-pixel, and the driving method of the display panel includes the following steps.

In block S1, the presence of a failed main sub-pixel in each pixel is detected. For any one of the pixels, block S3 is performed where all main sub-pixels are working, otherwise block S2 is performed.

In block S2, for the pixel having a failed main sub-pixel, the backup sub-pixel cooperates with normal main sub-pixels to output metamerized light of a target color.

In block S3, for the pixel without a failed main sub-pixel, the backup sub-pixel does not emit light, and normal main sub-pixels cooperate to emit the target color.

In block S1, if it is detected that a pixel with a dead sub-pixel exists, the method further includes recording the pixel with the dead sub-pixel in a look-up table. When block S2 is performed, the record of a backup sub-pixel in the pixel emitting light is in the look-up table.

In block S1, if it is detected that a pixel P has no dead sub-pixel, block S2 is not executed. In all the pixels P, the backup sub-pixels do not emit light, and each pixel P outputs a correct target color.

In some embodiments, the backup sub-pixel includes a backup light-emitting element that emits blue light and a color conversion layer. The color conversion layer is on light-emitting side of the backup light-emitting element, and is used for converting the blue light emitted by the backup light-emitting element into white light. In block S2, the display panel enables the pixels to output the metamerized light of the target color by adjusting the spectral power distribution of the white light converted from the blue light.

In some embodiments, the backup sub-pixel includes three backup light-emitting elements emitting blue light and a red conversion block, a green conversion block, and a blue conversion block. The red conversion block, the green conversion block and the blue conversion block are respectively located on the light-emitting side of the three backup light-emitting elements for converting the blue light emitted by the corresponding backup light-emitting elements into red light, green light and blue light. In block S2, the display panel independently adjusts the spectral power distribution of the red light converted from the blue light, the spectral power distribution of the green light converted from the blue light, and the spectral power distribution of the blue light converted from the blue light. The pixels thus output metamerized light of the target color.

The driving method of the display panel utilizes the phenomenon of metamerism and adjusts the output of the pixel, so that the human eye perceives the same color regardless of a failed main sub-pixel in any pixel. Compared with the method of directly removing the failed light-emitting element and picking up the qualified light-emitting element for replacement, the difficulty of repair is reduced, and time is saved. In addition, compared with the method of preparing a redundant light-emitting element for each light-emitting element, the display panel relatively reduces the number of light-emitting elements and reduces the cost. Moreover, it can also provide products with high and low specification brightness according to whether there are dead sub-pixels in the pixels. Thus, the original defective product does not need to be scrapped, and it is still saleable.

It is to be understood, even though information and advantages of the present exemplary embodiments have been set forth in the foregoing description, together with details of the structures and functions of the present exemplary embodiments, the disclosure is illustrative only. Changes may be made in detail, especially in matters of shape, size, and arrangement of parts within the principles of the present exemplary embodiments to the full extent indicated by the plain meaning of the terms in which the appended claims are expressed.

What is claimed is:

1. A display panel comprising a plurality of pixels, wherein each of the plurality of pixels comprising a plurality of main sub-pixels and a backup sub-pixel, and for any one of the plurality of pixels, if there is a failed main sub-pixel, the backup sub-pixel is configured for cooperating with normal main sub-pixels to output metamerized light of a target color;
   the backup sub-pixel comprises:
   a first backup light-emitting element for emitting blue light;
   a second backup light-emitting element for emitting blue light;
   a third backup light-emitting element for emitting blue light;
   a red conversion block on the first backup light-emitting element and configured for converting the blue light emitted by the first backup light-emitting element into red light;
   a green conversion block on the second backup light-emitting element and configured for converting the blue light emitted by the second backup light-emitting element into green light; and
   a blue conversion block on the third backup light-emitting element and configured for converting the blue light emitted by the third backup light-emitting element into blue light with a desired wavelength band.

2. The display panel of claim 1, further comprising a controller, wherein the controller is configured for controlling each of the plurality of pixels to output the metamerized light of the target color by independently adjusting spectral power distribution of the red light converted from the blue light, spectral power distribution of the green light converted from the blue light, and spectral power distribution of the blue light with the desired wavelength band converted from the blue light.

3. The display panel of claim 1, wherein a material of each of the red conversion block, the green conversion block, and the blue conversion block is quantum dots or phosphors.

4. The display panel of claim 1, wherein the plurality of main sub-pixels comprises a red sub-pixel, a green sub-pixel, and a blue sub-pixel.

5. The display panel of claim 4, wherein the red sub-pixel, the green sub-pixel, the blue sub-pixel and the backup sub-pixel in each of the plurality of pixels are arranged in a 2×2 matrix.

6. The display panel of claim 5, wherein each red sub-pixel is alternating with one green sub-pixel in one row, and each blue sub-pixel is alternating with one backup sub-pixel in another row, each red sub-pixel is alternating with one blue sub-pixel in one column, and each green sub-pixel is alternating with one backup sub-pixel in another column.

7. The display panel of claim 1, wherein the backup sub-pixel and each of the plurality of main sub-pixels comprise an OLED.

8. The display panel of claim 1, wherein the backup sub-pixel and each of the plurality of main sub-pixels both comprise a LED.

9. The display panel of claim 8, wherein a size of the LED is less than 100 microns.

10. A method for driving a display panel comprising a plurality of pixels, each of the plurality of pixels comprising a plurality of main sub-pixels and a backup sub-pixel, the method comprising:
    detecting whether there is a failed main sub-pixel in each of the plurality of pixels, wherein for any one of the plurality of pixels, if there is a failed main sub-pixel, the backup sub-pixel cooperates with normal main sub-pixels to output metamerized light of a target color; otherwise, the backup sub-pixel does not work, and the plurality of main sub-pixels outputs the target color;
    wherein the backup sub-pixel comprises:
    a first backup light-emitting element for emitting blue light;
    a second backup light-emitting element for emitting blue light;
    a third backup light-emitting element for emitting blue light;
    a red conversion block on the first backup light-emitting element and configured for converting the blue light emitted by the first backup light-emitting element into red light;
    a green conversion block on the second backup light-emitting element and configured for converting the blue light emitted by the second backup light-emitting element into green light; and
    a blue conversion block on the third backup light-emitting element and configured for converting the blue light emitted by the third backup light-emitting element into blue light with a desired wavelength band;
    the method further comprises independently adjusting spectral power distribution of the red light converted from the blue light, spectral power distribution of the green light converted from the blue light, and spectral power distribution of the blue light with the desired wavelength band converted from the blue light to output metamerized light of the target color.

* * * * *